United States Patent
Lee et al.

(10) Patent No.: US 10,061,215 B2
(45) Date of Patent: Aug. 28, 2018

(54) PATTERNING METHOD AND PATTERNING APPARATUS FOR FABRICATING A RESIST PATTERN

(71) Applicant: TAIWAN SEMICONDUCTOR MANUFACTURING CO., LTD., Hsinchu (TW)

(72) Inventors: Yung-Yao Lee, Zhubei (TW); Jui-Chun Peng, Hsinchu (TW); Ho-Ping Chen, Jhubei (TW); Heng-Hsin Liu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 32 days.

(21) Appl. No.: 15/182,348

(22) Filed: Jun. 14, 2016

(65) Prior Publication Data

US 2017/0277044 A1 Sep. 28, 2017

Related U.S. Application Data

(60) Provisional application No. 62/313,670, filed on Mar. 25, 2016.

(51) Int. Cl.
*G03F 9/00* (2006.01)

(52) U.S. Cl.
CPC .......... *G03F 9/7034* (2013.01); *G03F 9/7084* (2013.01); *G03F 9/7088* (2013.01)

(58) Field of Classification Search
CPC ........ G03F 7/20; G03F 9/7034; G03F 9/7084; G03F 9/7088
USPC ..................................... 430/22, 30
See application file for complete search history.

(56) References Cited

U.S. PATENT DOCUMENTS 9,158,209 B2    10/2015   Chen et al.

*Primary Examiner* — Christopher G Young
(74) *Attorney, Agent, or Firm* — McDermott Will & Emery LLP

(57) ABSTRACT

In a method for fabricating a resist pattern, a substrate coated with a photo resist is loaded on a stage of an exposure apparatus. Underlying patterns are fabricated on the substrate. A surface slope of an exposure area on the substrate is measured. An alignment measurement is performed by detecting an alignment pattern formed in the underlying patterns. An alignment measurement result is corrected based on the measured surface slope. The substrate is aligned to a photo mask by using the corrected alignment measurement result. The photo resist is exposed to radiation passing through the photo mask to form patterns.

20 Claims, 5 Drawing Sheets

PATTERNING METHOD AND PATTERNING APPARATUS FOR FABRICATING A RESIST PATTERN

CROSS-REFERENCE TO RELATED APPLICATIONS

The subject application claims priority to U.S. Provisional Application No. 62/313,670, filed Mar. 25, 2016, the subject matter of which is incorporated herein by reference in entirety.

TECHNICAL FIELD

The disclosure relates to a patterning method and an apparatus for fabricating resist patterns in device manufacturing, such as an integrated circuit, more particularly to a lithography process and lithography apparatus, such as a scanner and a stepper.

BACKGROUND

As the semiconductor industry introduces new generations of integrated circuits (ICs) having higher performance and greater functionality, the density of the elements that form the ICs is increased, while the dimensions and spacing between components or elements of the ICs are reduced. As components become smaller and patterning techniques become more precise, reducing overlay errors of the exposed pattern and the underlying pattern becomes more important. Accordingly, what is needed is a method for improving alignment accuracy in the patterning process used to expose a substrate such as a semiconductor wafer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
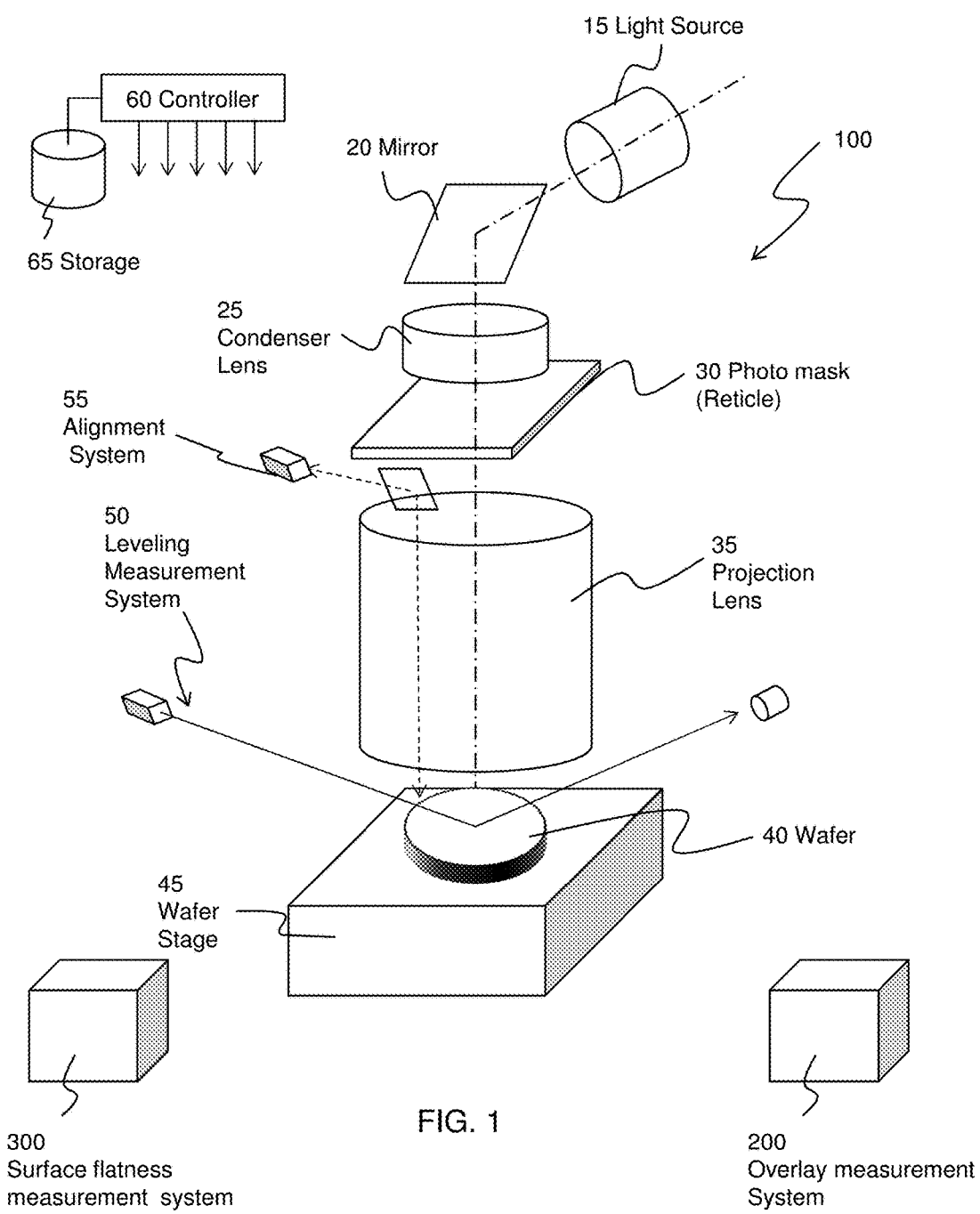
FIG. 1 shows an exemplary exposure apparatus according to one embodiment of the present disclosure.

FIG. 1 shows an exemplary exposure apparatus according to one embodiment of the present disclosure.

The exposure apparatus 100 is, for example, a scanner or a stepper used for a lithography process in a fabrication of a semiconductor device or a flat panel display.

The exposure apparatus 100 includes, among other features, a light source 15, for example, an ArF excimer laser system, one or more mirrors 20, a condenser lens 25, a wafer stage 45, a projection lens 35, a wafer alignment measurement system 55, a leveling measurement system 50, and a controller 60. The controller 60 includes a processing circuit, such as a CPU or a microprocessor, and a storage device (memory) 65, such as a hard disk drive or a flash memory. The controller, by executing one or more control programs stored in the storage device 65 by the processing circuit, controls operations of the exposure apparatus 100 according to the control program. The basic lithography operations are described in, for example, U.S. Pat. No. 9,158,209, the contents of which is incorporated herein by reference.

In the lithography operation using the exposure apparatus 100, a photo mask (or a reticle) 30 is loaded on a photo mask stage (not shown) of the exposure apparatus and is set in a predetermined position. A substrate, such as a semiconductor wafer 40 or a glass plate for a flat panel display, is loaded on the wafer stage 45. Unless the semiconductor wafer 40 has no underlying pattern, the wafer alignment measurement system 55 detects, by using a laser beam, alignment patterns formed by the underlying patterns. For example, the semiconductor wafer 40 has a plurality of exposure areas arranged in the X direction and the Y direction as a matrix, and each exposure area includes one or more areas corresponding to a semiconductor chip. The alignment patterns include an alignment pattern for the X direction and an alignment pattern for the Y direction, and arranged in a scribe lane between chips in some embodiments.

Based on the alignment measurement result, the wafer 40 (wafer stage 45) is moved to a predetermined position under the projection lens 35, and the first exposure area in the wafer 40 is exposed with the laser light. Then, the wafer 40 is moved so that the next exposure area is exposed. Such moving and exposing are repeated until all of the exposure areas in the wafer 40 are exposed. Then, the exposed wafer 40 is unloaded and the next wafer is loaded to be exposed.

The inventors of the present disclosure have found that the non-planar topography or unevenness of the surface of the wafer negatively affects the alignment performance of the wafer alignment measurement system 55.

Figure 2A:
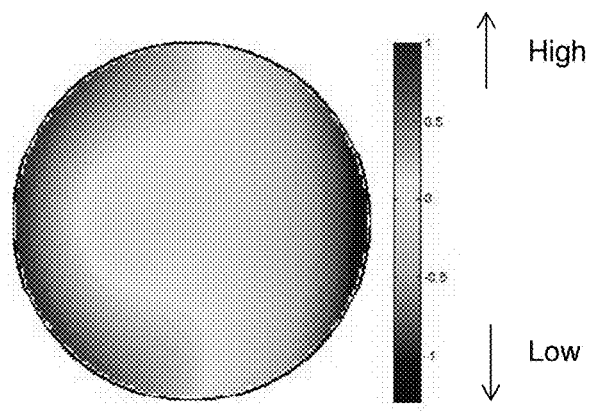
FIGS. 2A and 2B show the surface topography of a wafer with underlying structures.
Figure 2B:
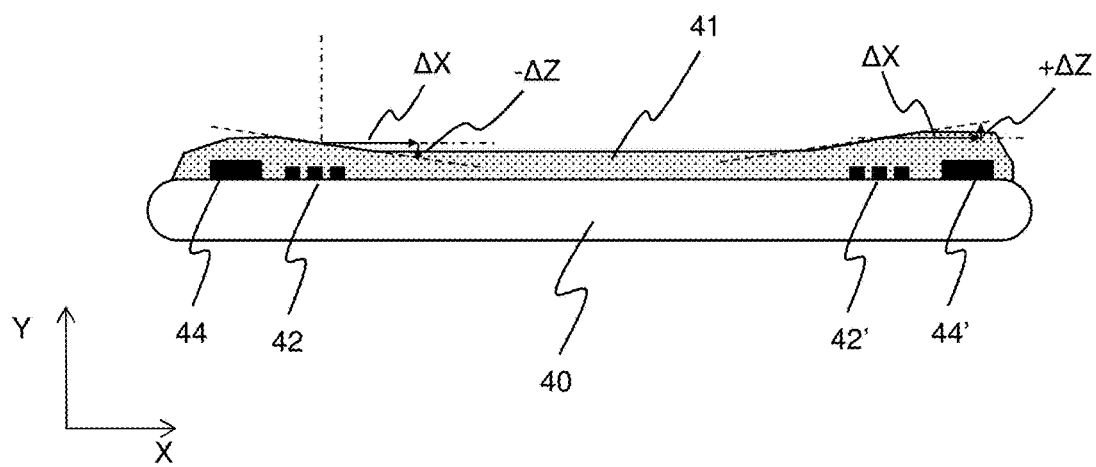

FIGS. 2A and 2B show the surface topology of the underlying structure formed on a wafer.

Before the wafer 40 is processed in the exposure apparatus 100, the wafer 40 has undergone several processes including a film deposition, a pattern etching, a thermal process or a planarization process, such as chemical mechanical polishing (CMP). These processes cause the upper surface of the wafer to become globally or locally uneven or non-planer, as shown in FIGS. 2A and 2B.

In FIG. 2A, for example, the surface of the underlying layer (e.g., an insulating layer) formed at the left area is higher than that formed at the right area. In FIG. 2B, the underlying patterns including alignment patterns 42 and 42' and other patterns 44 and 44' are formed on the wafer 40, and an insulating layer 41 is formed over the underlying patterns. In some embodiments, a CMP process is performed on the insulating layer 41. As shown in FIG. 2B, the surface of the insulating layer 41 above the alignment patterns 42 has a slope (gradient) $-\Delta Z/\Delta X$ due to the adjacent pattern 44, while the surface of the insulating layer 41 above the alignment patterns 42' has a slope $+\Delta Z/\Delta X$ due to the adjacent pattern 44'.

Figure 2C:
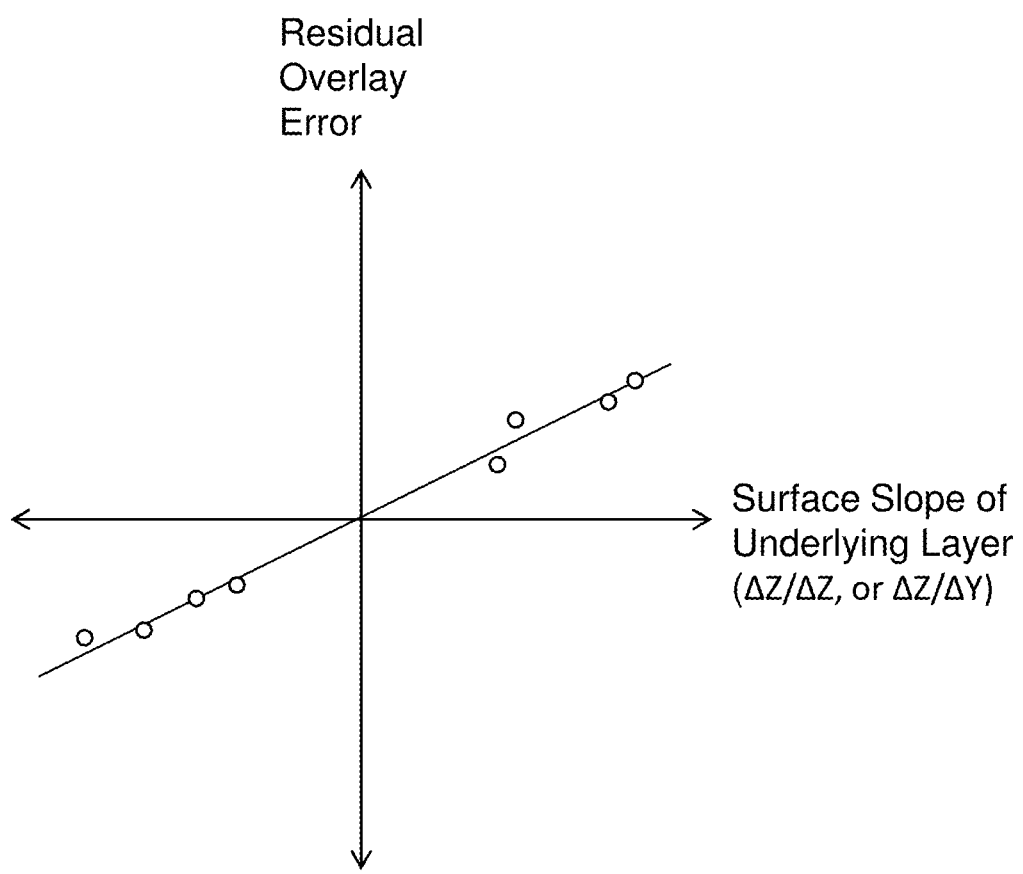
FIG. 2C shows the relationship between surface slopes of the local area of the substrate and residual overlay errors.

FIG. 2C shows the relationship between surface slopes of the local area of the substrate and residual overlay errors. In FIG. 2A, the horizontal axis shows a surface slope of the underlying layer formed on the wafer 40, and the vertical axis shows a residual overlay error measured and analyzed by an overlay measurement system 200. The surface slope may be expressed by $\Delta Z/\Delta X$ for the X direction and $\Delta Z/\Delta Y$ in the Y direction, and may be measured in units of nm/mm.

In one example shown in FIG. 2C, the residual overlay errors are substantially proportional to the surface slope $\Delta Z/\Delta X$ (or $\Delta Z/\Delta Y$). The proportional constant $\alpha$ for the X direction and the proportional constant $\beta$ for the Y direction can be calculated from FIG. 2C. In some embodiments, the proportional constant $\alpha$ for the X direction is equal to the proportional constant $\beta$ for the Y direction, and in other embodiments, the proportional constant $\alpha$ for the X direction is different from the proportional constant $\beta$ for the Y direction.

The proportional constants may vary depending on the underlying structures. It is possible to prepare a graph shown in FIG. 2C by experimentation and to obtain the proportional constants for respective underlying structures. In other words, different correction factor sets are prepared for different underlying structures.

The alignment measurement results can be corrected by using $\alpha \times (\Delta Z/\Delta X)$ and $\beta \times (\Delta Z/\Delta Y)$, where $\Delta Z/\Delta X$ is a measured surface slope in the X direction at the exposure area to be exposed, and $\Delta Z/\Delta Y$ is a measured surface slope in the Y direction, at the exposure area to be exposed.

Figure 3:
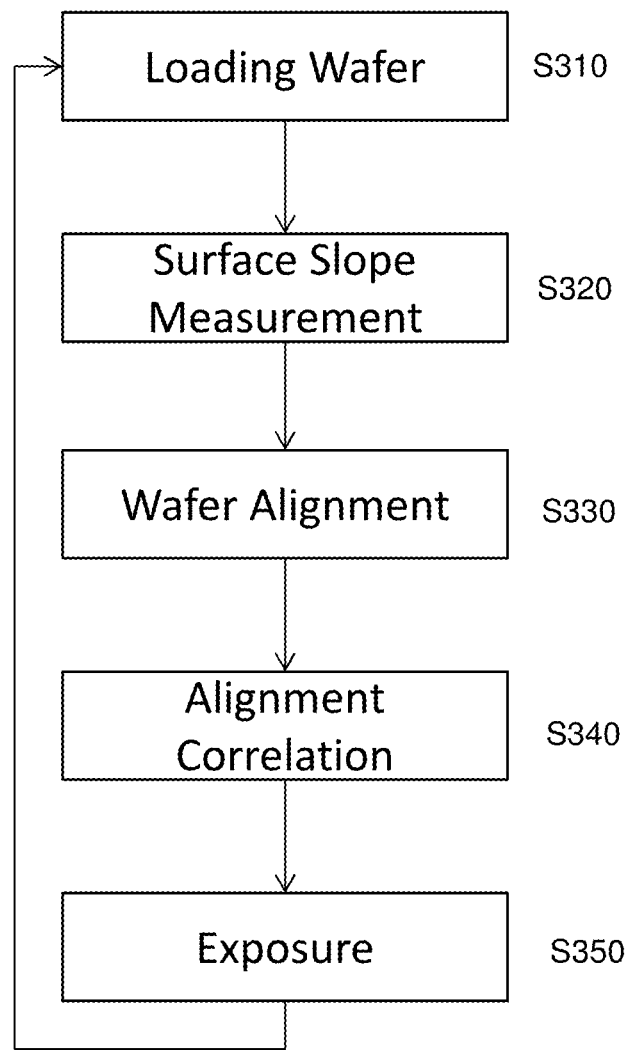
FIG. 3 is an exemplary flowchart according to one embodiment of the present disclosure.

FIG. 3 is an exemplary flowchart according to one embodiment of the present disclosure.

In S310, a wafer with underlying patterns is loaded on a stage of an exposure apparatus. The wafer is coated with a photo resist.

In S320, one or more surface slopes of one or more exposure areas on the substrate are measured. In some embodiments, the leveling measurement system of the exposure apparatus is used to measure the surface slope.

In a conventional leveling measurement system, the surface flatness (or slope) of the center area of the exposure area with respect to the projection lens, which defines the standard surface, is measured. In some embodiments, the surface slope at the center area of the exposure area is used in the alignment error correction. In some embodiments, the surface slope of a portion of the exposure area at which the alignment patterns are formed in the underlying pattern is measured.

In other embodiments, the surface slopes of several portions within the exposure area are measured, and the average value of the measured surface slopes is used as the alignment error correction.

In S330, by using a wafer alignment system, an alignment measurement is performed by detecting an alignment pattern formed in the underlying patterns.

There are generally two types of alignment methods according to the present disclosure. One is a global alignment method, in which the alignment patterns of several or all exposure areas are measured, measurement results are statistically analyzed and then the exposure area on the wafer is moved to the correct location under the projection lens by using the analyzed alignment information. The other one is a die-by-die alignment method, in which the alignment patterns of the exposure area to be exposed are measured just before the exposure, the position of the exposure area on the wafer corrected by using the alignment measurement results, and then the exposure is performed. Of course, these two methods can be utilized together.

In S340, after the alignment measurement is performed, the alignment measurement result is corrected based one the measured surface slope. As set forth above, the alignment measurement results can be corrected by using $\alpha \times (\Delta Z/\Delta X)$ and $\beta \times (\Delta Z/\Delta Y)$, where $\Delta Z/\Delta X$ is a measured surface slope in the X direction at the exposure area to be exposed, $\Delta Z/\Delta Y$ is a measured surface slope in the Y direction, at the exposure area to be exposed. The correction factors $\alpha$ and $\beta$ may be predetermined by experimentation carried out in advance.

In S350, the exposure area of the wafer to be exposed is moved to a correct position which is aligned to a photo mask by using the corrected alignment measurement result, and patterns on the photo mask are exposed to the photo resist.

The moving and the exposing are repeated so as to expose all exposure areas on the substrate. After all of the exposure areas are exposed, the wafer is unloaded from the exposure apparatus, and the next wafer is loaded.

Figure 4:
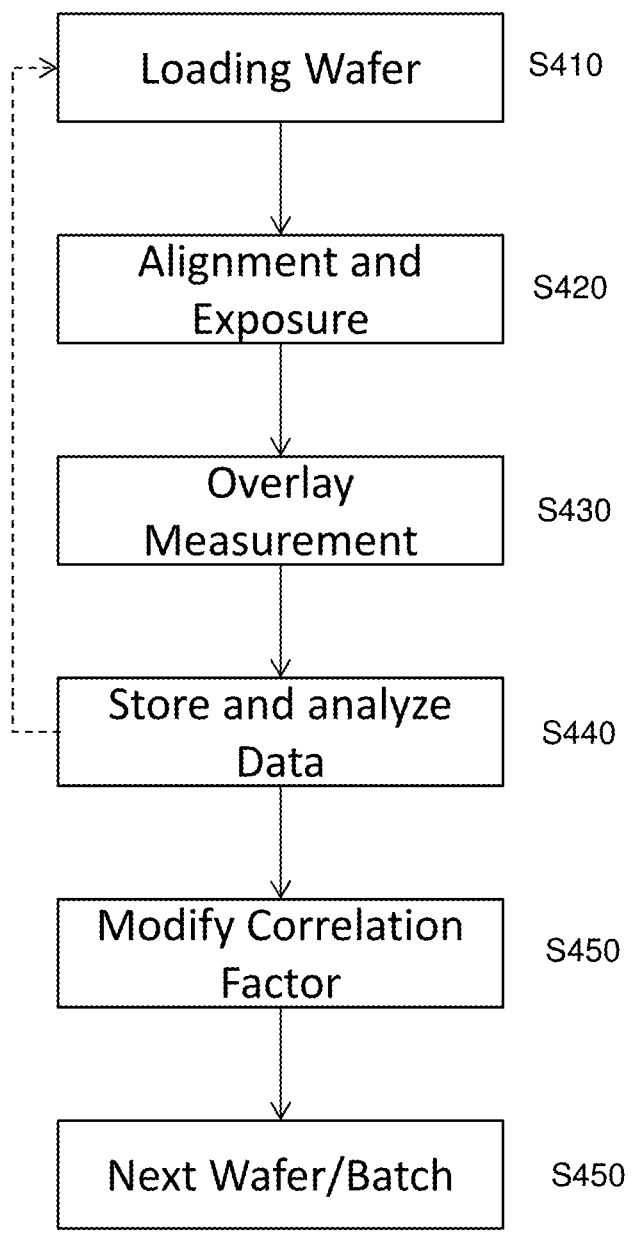
FIG. 4 is an exemplary flowchart according to another embodiment of the present disclosure.

FIG. 4 is an exemplary flowchart according to another embodiment of the present disclosure.

In S410, a wafer with underlying patterns is loaded on a stage of an exposure apparatus. The wafer is coated with a photo resist.

In S420, the operations of S320-S350 are performed so that all of the exposure areas are exposed.

In S430, after the exposed photoresist is developed, overlay errors between the developed photo resist pattern and the underlying pattern are measured by using an overlay measurement system 200. In S440, the measured results of overlay measurement are stored in a memory of the overlay measurement system 200, the storage 65 of the exposure apparatus 100 or a memory device of other control systems.

In S450, based on the overlay measurement results and the measurement results of the surface slopes of the same wafer, the correction factors $\alpha$ and $\beta$ are updated. In S460, the next wafer is then exposed by using the updated correction factors $\alpha$ and $\beta$.

In some embodiments, the correction factors are updated after several wafers, for example, one batch of wafers, are processed and measured.

In the above embodiments, the correction factors (proportional constants) $\alpha$ and $\beta$ are obtained by linear approximation of the experimental data as shown in FIG. 2B. In some embodiments, higher order approximation (e.g., third order, etc.) or other approximation formulas can be used.

In the above embodiments, the leveling measurement system of the exposure apparatus is utilized to measure the surface slopes. By utilizing the leveling measurement system of the exposure apparatus, it is not necessary to add another slope measurement system, and thus it is possible to suppress an increase in cost of the exposure apparatus.

In other embodiments, a surface flatness measurement system 300 can be utilized to measure the surface slopes. For example, the surface slopes of the wafer to be exposed are measured by the surface flatness measurement system 300, and the measured results are sent to the exposure apparatus 100 to correct alignment measurement results. If throughput of the surface flatness measurement system 300 is sufficiently high, it is not necessary to measure the surface slope in the exposure apparatus, and thus it is possible to improve the throughput of the exposure apparatus 100.

In the above embodiments, the exposure apparatus 100 includes, among other features, a controller 60 for controlling the exposure apparatus, including a processing circuit and a non-transitory memory 65 storing a control program. The control program, when executed by the processing circuit, causes the controller to perform the operations as set from the above. Further, a non-transitory memory 65 may be a hard disk drive, a flash memory, a CD-ROM, a DVD-ROM/RAM, or any non-transitory memory that can be read by the controller 65 of the exposure apparatus. The control program may be installed in the exposure apparatus through a network.

In the above embodiments, the exposure apparatus 100 utilizes an ArF excimer laser as a light source. However, other types of energy beams can be used. For example, UV light, KrF excimer layer, $F_2$ excimer laser, EUV (extreme ultra violet) light, X-ray, or electron beam can be used as the energy beam source. When EUV light or X-ray is used, a reflective optical system is used. In electron beam lithography, an electromagnetic deflection system is used. The foregoing alignment correction technology can be employed in any exposure apparatus.

In the present disclosure, by correcting the wafer alignment position based on the surface slope of the underlying structure formed on a wafer (or substrate) to be exposed, it is possible to achieve more precise wafer alignment and to reduce residual overlay errors in a lithography process. By using the surface topology information to correct the alignment measurement results, it is possible to reduce the residual overlay errors by about 10% to about 50% compared with the case where the surface topology information is not used.

The various embodiments or examples described herein offer several advantages over the existing art, as set forth above. It will be understood that not all advantages have been necessarily discussed herein, no particular advantage is required for all embodiments or examples, and other embodiments or examples may offer different advantages.

In accordance with one aspect of the present disclosure, in a method for fabricating a resist pattern, a substrate coated with a photo resist is loaded on a stage of an exposure apparatus. Underlying patterns are fabricated on the substrate. A surface slope of an exposure area on the substrate is measured. An alignment measurement is performed by detecting an alignment pattern formed in the underlying patterns. An alignment measurement result is corrected based on the measured surface slope. The substrate is aligned to a photo mask by using the corrected alignment measurement result. The photo resist is exposed to radiation passing through the photo mask to form patterns on the photo resist.

In accordance with another aspect of the present disclosure, in a method for fabricating a resist pattern by using an exposure apparatus, a surface slope of an exposure area on a substrate is measured. An alignment measurement is performed by detecting an alignment pattern formed in the underlying patterns. An alignment measurement result is corrected based on the measured surface slope and a correction factor. The substrate is aligned to a photo mask by using the corrected alignment measurement result. Patterns are exposed on the photo resist. The aligning and exposing are repeated so as to expose all exposure areas on the substrate. Overlay errors of the patterns are measured after all exposure areas on the substrate are exposed. The correction factor is updated based on the measured overlay errors.

In accordance with another aspect of the present disclosure, an exposure apparatus includes a wafer stage, a projection lens, an alignment measurement system, a leveling measurement system, and a controller for controlling the exposure apparatus. The controller includes a processing circuit and a non-transitory memory storing a control program. The control program, when executed by the processing circuit, causes the controller to perform: loading a wafer coated with a photo resist on a stage of an exposure apparatus, where underlying patterns are fabricated on the wafer; measuring a surface slope of an exposure area on the wafer by using the leveling measurement system; performing an alignment measurement, by using the alignment measurement system, by detecting an alignment pattern formed in the underlying patterns; correcting an alignment measurement result based on the measured surface slope; aligning the wafer to a photo mask by using the corrected alignment measurement result; and exposing the photo resist to radiation passing through the photo mask to form patterns on the photo resist.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a resist pattern, comprising:
   loading a substrate coated with a photo resist on a stage of an exposure apparatus, underlying patterns being fabricated on the substrate;
   measuring, by the exposure apparatus, a surface slope of an exposure area on the substrate with the photo resist;
   performing, by the exposure apparatus, an alignment measurement by detecting an alignment pattern formed in the underlying patterns of the substrate with the photo resist, thereby obtaining an alignment measurement result;
   correcting, by the exposure apparatus, the alignment measurement result based on the measured surface slope;

aligning the substrate with the photo resist to a photo mask by using the corrected alignment measurement result; and exposing the photo resist to radiation passing through the photo mask to form patterns.

2. The method of claim 1, wherein the moving and the exposing are repeated so as to expose all exposure areas on the substrate.

3. The method of claim 1, wherein the surface slopes are measured at areas in which the alignment patterns are formed.

4. The method of claim 3, wherein the surface slopes are measured by using a leveling measurement system of the exposure apparatus.

5. The method of claim 1, wherein the alignment measurement results are corrected by using $\alpha \times (\Delta Z/\Delta X)$ and $\beta \times (\Delta Z/\Delta Y)$, where $\Delta Z/\Delta X$ is a measured surface slope in a X direction, $\Delta Z/\Delta Y$ is a measured surface slope in a Y direction perpendicular to the X direction, $\alpha$ is a correction factor for the X direction and $\beta$ is a correction factor for the Y direction.

6. The method of claim 5, wherein the correction factors are predetermined.

7. The method of claim 5, wherein the correction factors are updated based on overlay measurement results of a preceding substrate in which a resist pattern is formed.

8. The method of claim 1, wherein:
in the measuring the surface slope, surface slopes for plural exposure areas are measured, and
in the correcting the alignment measurement, one or more surface slopes of the exposure areas corresponding to the alignment pattern is used.

9. A method for fabricating a resist pattern by using an exposure apparatus, comprising:
measuring a surface slope of an exposure area on a substrate coated with a non-developed photo resist;
performing, by the exposure apparatus, an alignment measurement by detecting an alignment pattern formed in underlying patterns of the substrate disposed under the photo resist, thereby obtaining an alignment measurement result;
correcting, by the exposure apparatus, the alignment measurement result based on the measured surface slope and a correction factor;
aligning, by the exposure apparatus, the substrate with the photo resist to a photo mask by using the corrected alignment measurement result;
exposing, by the exposure apparatus, a photo resist on the substrate to radiation passing through the photo mask to form patterns;
repeating the aligning and exposing, by the exposure apparatus, so as to expose all exposure areas on the substrate;
measuring overlay errors of the patterns, by an overlay measurement system, after all exposure areas on the substrate are exposed; and
updating the correction factor based on the measured overlay errors.

10. The method of claim 9, wherein the surface slopes are measured at areas in which the alignment patterns are formed.

11. The method of claim 10, wherein the surface slopes are measured by using a leveling measurement system of the exposure apparatus.

12. The method of claim 9, wherein the surface slopes are measured by a surface measurement tool other than the exposure apparatus.

13. The method of claim 9, wherein the alignment measurement results are corrected by using $\alpha \times (\Delta Z/\Delta X)$ and $\beta \times (\Delta Z/\Delta Y)$, where $\Delta Z/\Delta X$ is a measured surface slope in a X direction, $\Delta Z/\Delta Y$ is a measured surface slope in a Y direction perpendicular to the X direction, $\alpha$ is a correction factor for the X direction and $\beta$ is a correction factor for the Y direction.

14. The method of claim 13, wherein the correction factors are predetermined.

15. The method of claim 13, wherein:
in the measuring the surface slope, surface slopes for plural exposure areas are measured, and
in the correcting the alignment measurement, one or more surface slopes of the exposure areas corresponding to the alignment pattern is used.

16. A method for fabricating a resist pattern, comprising:
loading a substrate coated with a photo resist on a stage of a scanner, underlying patterns being fabricated on the substrate, a thickness of the photo resist at a center of the substrate being thinner than a thickness of the photo resist at a peripheral area of the substrate;
measuring a surface slope of the photo resist over the substrate;
performing, by the scanner, an alignment measurement by detecting an alignment pattern formed in the underlying patterns, thereby obtaining an alignment measurement result;
correcting, by the scanner, the alignment measurement result based on the measured surface slope;
aligning, by the scanner, the substrate to a photo mask by using the corrected alignment measurement result; and
exposing the photo resist to radiation passing through the photo mask to form patterns.

17. The method of claim 16, wherein the moving and the exposing are repeated so as to expose all exposure areas on the substrate.

18. The method of claim 16, wherein the surface slopes are measured at areas in which the alignment patterns are formed.

19. The method of claim 18, wherein the surface slopes are measured by using a leveling measurement system of the scanner.

20. The method of claim 16, wherein the alignment measurement results are corrected by using $\alpha \times (\Delta Z/\Delta X)$ and $\beta \times (\Delta Z/\Delta Y)$, where $\Delta Z/\Delta X$ is a measured surface slope in a X direction, $\Delta Z/\Delta Y$ is a measured surface slope in a Y direction perpendicular to the X direction, $\alpha$ is a correction factor for the X direction and $\beta$ is a correction factor for the Y direction.

* * * * *